(12) United States Patent
Chen et al.

(10) Patent No.: US 11,476,149 B2
(45) Date of Patent: Oct. 18, 2022

(54) SUBSTRATE AND DISPLAY DEVICE

(71) Applicant: PLAYNITRIDE DISPLAY CO., LTD., Miaoli County (TW)

(72) Inventors: Pei-Hsin Chen, Miaoli County (TW); Yi-Chun Shih, Miaoli County (TW); Yi-Ching Chen, Miaoli County (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 0 days.

(21) Appl. No.: 17/016,423

(22) Filed: Sep. 10, 2020

(65) Prior Publication Data

US 2021/0210371 A1 Jul. 8, 2021

(30) Foreign Application Priority Data

Jan. 8, 2020 (TW) ................................. 109100551

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01)

(58) Field of Classification Search
CPC . H01L 21/6835; H01L 25/0753; H01L 33/62; H01L 2221/68363; H01L 2221/68354; H01L 24/00; H01L 2221/68309; H01L 24/12

USPC .......................................................... 257/98
See application file for complete search history.

(56) References Cited

U.S. PATENT DOCUMENTS

| | | | | |
|---|---|---|---|---|
| 5,641,946 A * | 6/1997 | Shim | .................. | H01L 21/4853 174/261 |
| 7,091,619 B2 * | 8/2006 | Aoyagi | ............. | H01L 23/49816 257/777 |
| 7,564,130 B1 * | 7/2009 | Li | ........................... | H01L 24/14 257/734 |
| 8,524,514 B2 * | 9/2013 | Lasfargues | .............. | H01L 24/14 438/26 |
| 8,920,934 B2 * | 12/2014 | Jiang | .................... | H05K 3/3494 428/613 |
| 8,952,532 B2 * | 2/2015 | Zheng | ............... | H01L 23/49816 257/737 |
| 9,048,168 B2 * | 6/2015 | Kwon | ..................... | H01L 25/00 |
| 2012/0313262 A1 * | 12/2012 | Suzuki | ............. | H01L 23/49816 257/777 |
| 2016/0351607 A1 * | 12/2016 | Liu | .................. | H01L 27/14618 |
| 2020/0146183 A1 * | 5/2020 | Lofgreen | ........... | H05K 7/20254 |

* cited by examiner

*Primary Examiner* — Vu A Vu
(74) *Attorney, Agent, or Firm* — WPAT, PC (57) ABSTRACT

The present invention discloses a substrate configured to receive a plurality of micro elements on a carrier board. The substrate comprises a body, a first conductive bump, and a second conductive bump. The body has a first surface, a transfer area is defined within the first surface, and a central portion and a peripheral portion is defined within the transfer area. The first conductive bump, disposed on the central portion, has a first volume. The second conductive bump, disposed on the peripheral portion, has a second volume. Wherein the first volume is different from the second volume.

20 Claims, 9 Drawing Sheets

SUBSTRATE AND DISPLAY DEVICE

CROSS REFERENCE TO RELATED APPLICATION

The present application claims priority to Taiwan patent application Serial No. 109100551 filed on Jan. 8, 2020, the entire content of which is incorporated by reference to this application.

1. Field of the Invention

The present invention pertains to a substrate and a display device, in particular to a substrate for receiving a plurality of micro elements and a display device having a plurality of micro elements.

2. Description of the Prior Art

When manufacturing a micro LED display, a plurality of micro LEDs have to be formed on a substrate (such as a temporary substrate), and then a large amount of micro LEDs are mass transferred to corresponding positions on another substrate (for example, temporary substrate or permanent substrate). However, since the thermal expansion coefficients of the various materials may be different, the substrate carrying micro LEDs may be deformed (such as bowing or warpage) while being heated and cooled due to thermal stress. In practice, when the substrate is warped, the micro LEDs on the substrate are also displaced, making it difficult to align the micro LEDs with the components on the other substrate, thereby affecting the transfer yield.

SUMMARY OF THE INVENTION

The present invention provides a substrate capable of receiving micro elements on a warped carrier board more efficiently.

The present invention discloses a substrate configured to receive a plurality of micro elements on a carrier board. The substrate comprises a body, a first conductive bump, and a second conductive bump. The body has a first surface, a transfer area is defined within the first surface, and a central portion and a peripheral portion is defined within the transfer area. The first conductive bump, disposed on the central portion, has a first volume. The second conductive bump, disposed on the peripheral portion, has a second volume. Wherein the first volume is different from the second volume.

In some embodiments, the first conductive bump may have a first thickness, the second conductive bump may have a second thickness, and when the first volume is smaller than the second volume, the first thickness is smaller than the second thickness. In addition, the first conductive bump may have a first contact area on the first surface, the second conductive bump may have a second contact area on the first surface, and the first contact area and the second contact area are the same.

In some embodiments, the first conductive bump may have a first contact area on the first surface, the second conductive bump may have a second contact area on the first surface, and when the first volume is smaller than the second volume, the first contact area is smaller than the second contact area. In addition, the first conductive bump may have a first thickness, the second conductive bump may have a second thickness, and the first thickness and the second thickness are the same. Moreover, the substrate may have another first conductive bump, the two adjacent first conductive bumps are separated by a first distance, and the adjacent first conductive bump and the adjacent second conductive bump are separated by a second distance, when the first volume is smaller than the second volume, the first distance is larger than the second distance.

In some embodiments, the first conductive bump may have a first thickness, the second conductive bump may have a second thickness, and when the first volume is larger than the second volume, and the first thickness is larger than the second thickness. In addition, the first conductive bump may have a first contact area on the first surface, the second conductive bump may have a second contact area on the first surface, and the first contact area and the second contact area are the same.

In some embodiments, the first conductive bump may have a first contact area on the first surface, the second conductive bump may have a second contact area on the first surface, and when the first volume is larger than the second volume, the first contact area is larger than the second contact area. In addition, the first conductive bump may have a first thickness, the second conductive bump may have a second thickness, and the first thickness and the second thickness are the same. Moreover, the substrate may further comprise another first conductive bump, the two adjacent first conductive bumps are separated by a first distance, and the adjacent first conductive bump and the adjacent second conductive bump are separated by a second distance, when the first volume is larger than the second volume, the first distance is smaller than the second distance.

The present invention discloses another substrate configured to receive a plurality of micro elements on a carrier board. The substrate comprises a body, a first conductive bump, and a second conductive bump. The body has a first surface, a transfer area is defined within the first surface, and a center point is defined within the transfer area. The first conductive bump, disposed within the transfer area, has a first cross sectional shape. The second conductive bump, disposed within the transfer area, has a second cross sectional shape. Wherein the first cross-sectional shape is different from the second cross-sectional shape, and the distance between the first conductive bump and the center point is smaller than the distance between the second conductive bump and the center point.

In some embodiments, the first conductive bump has a first volume, the second conductive bump has a second volume, and the first volume and the second volume can be the same. In addition, the first conductive bump may have a first thickness, the second conductive bump may have a second thickness, the first thickness is smaller than the second thickness. Besides, the first conductive bump may have a first contact area on the first surface, the second conductive bump may have a second contact area on the first surface, and the first contact area is larger than the second contact area.

In some embodiments, the first conductive bump may have a first thickness, the second conductive bump may have a second thickness, the first thickness is larger than the second thickness. Besides, the first conductive bump may have a first contact area on the first surface, the second conductive bump may have a second contact area on the first surface, and the first contact area is smaller than the second contact area. Moreover, the first conductive bump may have a first Young's modulus, the second conductive bump may have a second Young's modulus, and the first Young's modulus is larger than the second Young's modulus.

The present invention further provides display device, the display device has a substrate capable of receiving micro elements on a warped carrier board more efficiently.

The present invention discloses a display device comprises a substrate and a plurality of micro elements. The substrate comprises a body, a first conductive bump, and a second conductive bump. The body has a first surface, a transfer area is defined within the first surface, and a center point is defined within the transfer area. The first conductive bump, disposed within the transfer area, has a first volume and a first cross sectional shape. The second conductive bump, disposed within the transfer area, has a second volume and a second cross sectional shape. The plurality of micro elements respectively disposed on the first conductive bump and the second conductive bump. Wherein the first volume is different from the second volume, or the first cross-sectional shape is different from the second cross-sectional shape. Wherein the distance between the first conductive bump and the center point is smaller than the distance between the second conductive bump and the center point.

In some embodiments, the area of the first conductive bumps bonds the micro element and the area of the second conductive bumps bonds the micro element can be the same. Besides, the first conductive bump and the corresponding micro element has a first height from the substrate, the second conductive bump and the corresponding micro element has a second height from the substrate, and the first height can be different from the second height.

To summarize, the invention provides a substrate and a display device. The conductive bumps at different positions on the substrate are different, so that they can correspond to carrier boards with different warped shapes. For example, when the carrier board is warped upwardly (smiling face), the conductive bumps on the edge of the substrate may have a larger volume or a larger cross sectional area. Conversely, when the carrier board is warped downwardly (crying face), the conductive bumps on the edge of the substrate may have a smaller volume or a smaller cross-sectional area, correspondingly. Thereby, the substrate of the present invention can more efficiently receive the micro elements on the warped carrier board.

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
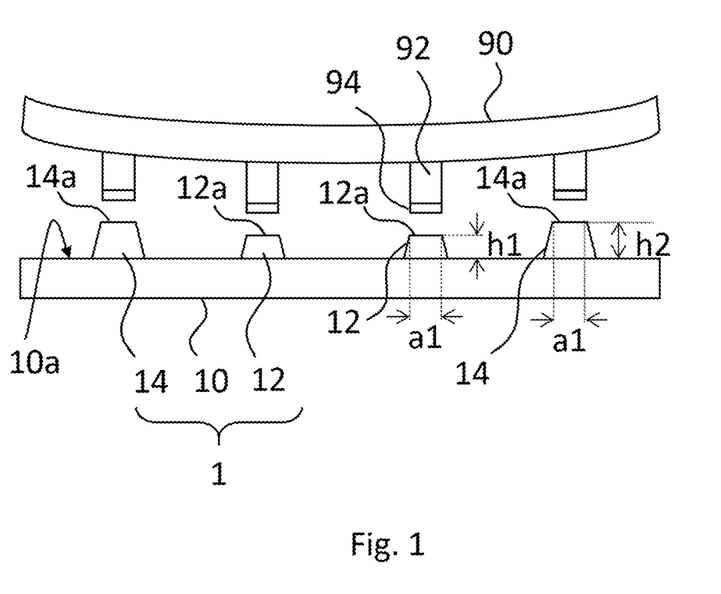
FIG. 1 is a schematic diagram of a substrate corresponded to a carrier board warped upwardly in accordance with an embodiment of the present invention.

Please refer to FIG. 1, FIG. 1 is a schematic diagram of a substrate corresponded to a carrier board warped upwardly in accordance with an embodiment of the present invention. As shown in FIG. 1, a substrate 1 disclosed in this embodiment can be used to receive a plurality of micro elements 92 on a carrier board 90. The micro elements 92 may be, but not limit to, vertical or flip chip micro LEDs. The micro elements 92 in some embodiments may also be applied to other micro devices, including micro integrated circuits, micro laser diodes, and micro sensors. The carrier board 90 may be, for example, an epitaxial growth substrate or a temporary substrate of the micro elements 92, and the substrate 1 of this embodiment may be a permanent substrate (such as display panel) of the micro elements 92 or another temporary substrate. As can be seen from FIG. 1, the carrier board 90 may include a plurality of micro elements 92, and the micro elements 92 are disposed on the side of the carrier board 90 facing the substrate 1. In one example, the carrier board 90 may be, but not limit to, a temporary carrier board such as a glass carrier board, a sapphire carrier board, a silicon carrier board, or an aluminum oxide carrier board (e.g. Al2O3) without working circuits thereon.

The substrate 1 includes a body 10, a plurality of first conductive bumps 12, and a plurality of second conductive bumps 14, wherein the body 10 may be, but not limit to, a complementary metal oxide semiconductor (CMOS) substrate, a low temperature poly-silicon (LTPS) substrate, a thin film transistor (TFT) substrate, or other substrates with working circuits thereon. Here, the body 10 may have a first surface 10a, the first surface 10a faces the carrier board 90, and the first conductive bumps 12 and the second conductive bumps 14 are disposed on the first surface 10a. In practice, the first conductive bumps 12 and the second conductive bumps 14 are configured to connect to metal pads 94, respectively. The first conductive bumps 12 and the second conductive bumps 14 can be disposed on the first surface 10a within a specific range, the specific range is, for example, a transfer area within the first surface 10a. When the substrate 1 receives the plurality of micro elements 92, it can be regarded as a display panel or a part of display device. In other words, the display device may comprise a plurality of micro elements 92, and the plurality of micro elements 92 are disposed on the corresponding first conductive bumps 12 and second conductive bumps 14 respectively.

Figure 2A:
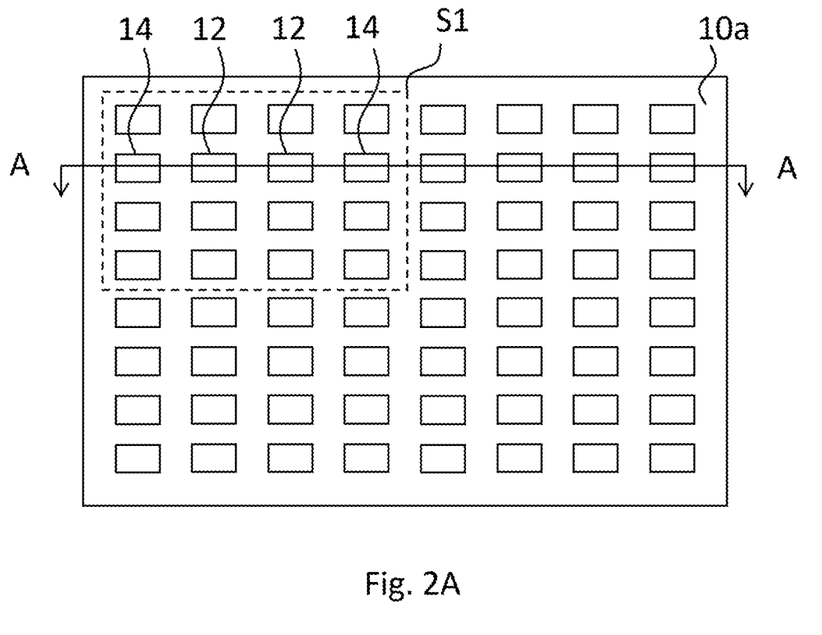
FIG. 2A is a top view of a substrate in accordance with another embodiment of the present invention.
Figure 2B:
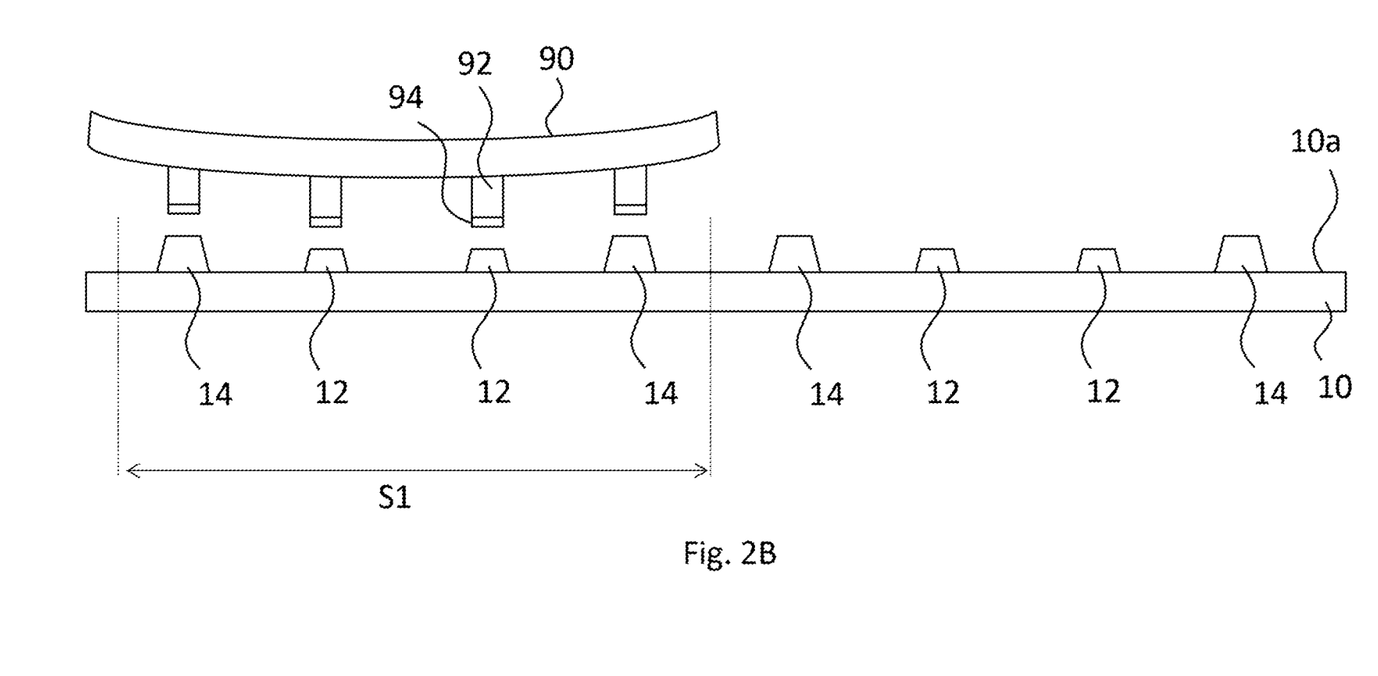
FIG. 2B is a cross sectional view along line AA in accordance with FIG. 2A.

For example, please refer to FIG. 2A and FIG. 2B together. FIG. 2A is a top view of a substrate in accordance with another embodiment of the present invention. FIG. 2B is a cross sectional view along line AA in accordance with FIG. 2A. As shown in the figures, the first conductive bumps 12 and the second conductive bumps 14 may be disposed on the first surface 10a, and the first conductive bumps 12 and the second conductive bumps 14 may be divided into a plurality of groups. Each group can be corresponded to a transfer area. In other words, the first surface 10a may contain a plurality of transfer areas, such as the transfer area S1, marked in FIG. 2A. While transferring the micro elements 92, the first surface 10a may receive the micro elements 92 in different batches. Of course, the first surface 10a can correspond to only one transfer area, that is, the transfer area may be, but not limit to, a part or all of the first surface 10a.

In an example, the transfer areas may be defined with a central portion and a peripheral portion, the first conductive bumps 12 may be disposed on the central position, and the second conductive bumps 14 may be disposed on the peripheral portion. Assuming that the transfer area is rectangular shape, the peripheral portion may be relatively closer to the periphery of the rectangle, and the central portion may be relatively closer to the center point of the rectangle. In other words, the first conductive bumps 12 defined in this embodiment can be closer to the center point of the transfer area, and the second conductive bumps 14 can be farther away from the center point of the transfer area. This embodiment does not limit the shape of the transfer area. The transfer area may be rectangular, circular, triangular, or other suitable geometric shapes. In practice, since the micro elements 92 on the carrier board 90 are regularly arranged, in order to receive the micro elements 92, the first conductive bump 12 and the second conductive bump 14 will be arranged corresponding to the arrangement of the micro elements 92.

Traditionally, some practical problems are encountered and the transfer yield is affected while transferring the micro elements 92 disposed on the carrier board 90. One of the problems is that the carrier board 90 may be slightly warped during the heating and cooling process, resulting in a displacement of the micro elements 92 on the carrier board 90 or an interval difference in the arrangement. Common warping of the carrier board 90 are, for example, warped upwardly and warped upwardly. The carrier board 90 warped upwardly means that the central portion of the carrier board 90 is closer to the body 10, and the peripheral portion is farther away from the body 10. The carrier board 90 warped downwardly means that the central portion of the carrier board 90 is farther away from the body 10, and the peripheral portion is closer to the body 10. Therefore, the micro elements 92 on the carrier board 90 may not be in the same horizontal plane because of the warpage problem of the carrier board 90. For example, in the upwardly warped carrier board 90, the micro elements 92 near the center of the carrier board 90 are much lower. Since the conductive bumps of the conventional substrate are the same, when the carrier board 90 is pressed against the conventional substrate, the bonding strength between the metal pads 94, of the micro elements 92 at different positions on the carrier board 90, and the conductive bumps will be different. For example, for the micro element 92 near the center of the carrier board 90, the bonding strength of the metal pad 94 and the conductive bump is relatively high. In contrast, for the micro element 92 near the edge of the carrier board 90, the metal pad 94 and the conductive bump are less tightly connected. As a result, the conventional substrate may have a problem of uneven conductivity of each micro element 92, and even affect the transfer yield.

Unlike the conventional substrate, this embodiment proposes a new substrate 1. As shown in FIG. 1, the carrier board 90 is warped upwardly, and the first conductive bumps 12 and the second conductive bumps 14 are designed to have different volumes due to different locations, in order to receive the micro elements 92 on the carrier board 90 more effectively. Those of ordinary skill in the art should understand that volume is related to area and thickness, and this embodiment demonstrates an example of adjusting thickness with a fixed area. In the example of FIG. 1, it is assumed that an area of the first conductive bumps 12 intended to contact the micro element 92 is a first contact area 12a, and an area of the second conductive bumps 14 intended to contact the micro element 92 is a second contact area 14a. The first contact area 12a and the second contact area 14a are the same, for example an area a1. Besides, the thickness of the first conductive bumps 12 and the second conductive bumps 14 will be different, for example, the thickness of the first conductive bumps 12 (the first thickness) is h1, the thickness of the second conductive bumps 14 (the second thickness) is h2, and the thickness h1 will be smaller than the thickness h2. That is, when the carrier board 90 is warped upwardly, FIG. 1 demonstrates that the volume of the first conductive bumps 12 (the first volume) is slightly smaller than the volume of the second conductive bumps 14 (the second volume).

Since the carrier board 90 of FIG. 1 is warped upwardly, the micro elements 92 near the center of the carrier board 90 are closer to the body 10, and the micro elements 92 near the edge of the carrier board 90 are away from the body 10. When the external pressure is applied to the carrier board 90 against the substrate 1, the carrier board 90 will get closer and closer to the body 10. Besides, the second conductive bumps 14 of this embodiment are more protruding than the first conductive bumps 12, the first conductive bumps 12 and the second conductive bumps 14 can contact each individual metal pad 94 about the same time. Those of ordinary skill in the art can understand that the volume of the first conductive bump 12 and the second conductive bump 14 can be determined according to the degree of warpage of the carrier board 90. For example, the user can measure the warpage of the carrier board 90 in the first place, and then determine how much thickness the first conductive bumps 12 and the second conductive bumps 14 should have. In an example, the thickness of the middle conductive bump (the first conductive bumps 12) and the edge conductive bump (the second conductive bumps 14) differ by no more than 50%, to avoid decreasing in yield due to large gap. In the substrate 1 of this embodiment, the first conductive bumps 12 and the second conductive bumps 14 can have approximately the same bonding strength with the metal pads 94, so that each micro element 92 can have the same conductivity, thereby improving the transfer yield. In the embodiment not shown in figures, more conductive bumps may also be included, wherein the conductive bumps can have gradually increased thickness and volume from the inside to the outside corresponded to the upwardly warped carrier board.

In contrast, when the carrier board 90 is pressed against the conventional substrate, it is also possible that the conventional substrate is subjected to uneven stress, which may easily cause damage to the micro elements 92 or the conventional substrate, and result in poor transfer yield. Taking the foregoing example of a conventional substrate, the metal pads 94 is less likely to be connected to the conductive bumps of the micro elements 92 at the edge of the carrier board 90. When the external pressure is applied to the carrier board 90 against the conventional substrate, in order to ensure that the micro elements 92 at the edge of the carrier board 90 can also be transferred, excessive pressure may be applied to cause the micro elements 92 at the center of the carrier board 90 to be pushed excessive toward the conventional substrate. For example, the metal pads 94 of the micro elements 92 at the center of the carrier board 90 may have excessively pressed the conductive bumps below, causing damage to the micro element 92 or the conventional substrate.

Figure 3:
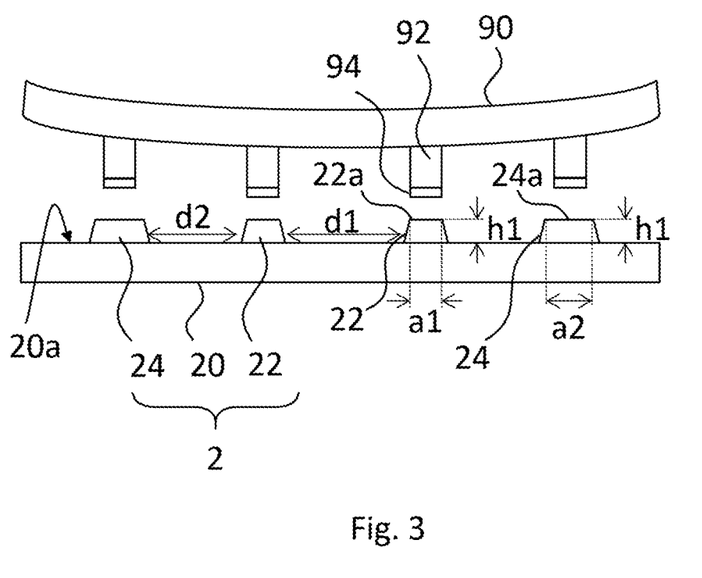
FIG. 3 is a schematic diagram of a substrate corresponded to a carrier board warped upwardly in accordance with another embodiment of the present invention.

The embodiment of FIG. 3 proposes another new substrate 2. Please refer to FIG. 1 and FIG. 3 together. FIG. 3 is a schematic diagram of a substrate corresponded to a carrier board warped upwardly in accordance with another embodiment of the present invention. Similar to the embodiment of FIG. 1, the carrier board 90 illustrated in FIG. 3 is also warped upwardly, and the substrate 2 also includes a body 20, a plurality of first conductive bumps 22 and a plurality of second conductive bumps 24. In order to allow the substrate 2 to receive the micro elements 92 on the carrier board 90 more effectively, the first conductive bumps 22 and the second conductive bumps 24 of this embodiment are also designed to have different volumes at different locations. Also, the volume of the first conductive bump 12 (the first volume) can be slightly smaller than the volume of the second conductive bump 14 (the second volume). Different from the embodiment of FIG. 1, FIG. 3 assumes that the thickness of the first conductive bumps 22 (the first thickness) is the same as the thickness of the second conductive bumps 24 (the second thickness), for example, both are thickness h1. Here, an area (the first contact area 22a) of the first conductive bumps 22 intended to contact the micro element 92 may be a1, and an area (the second contact area 24a) of the second conductive bumps 24 intended to contact the micro element 92 may be a2. The first contact area a1 will be smaller than the second contact area a2.

Using the same example mentioned above, since the carrier board 90 of FIG. 1 is warped upwardly, the micro elements 92 near the center of the carrier board 90 are closer to the body 10, and the micro elements 92 near the edge of the carrier board 90 are away from the body 10. When the external pressure is applied to the carrier board 90 against the substrate 1, the carrier board 90 will get closer and closer to the board body 10. Those skilled in the art should understand that when the metal pads 94 contacts the first conductive bumps 22 and the second conductive bumps 24, the stress to which the first conductive bump 22 is subjected should be slightly greater than the stress to which the second conductive bump 24 is subjected. However, since the volume of the first conductive bumps 22 in this embodiment is smaller, even if the external pressure applied to the carrier board 90 is large enough to ensure that the micro elements 92 at the edge of the carrier board 90 can be transferred, the first conductive bump 22 can cope with the external pressure by deformation more easily. For example, the small first conductive bump 22 can overflow between the metal pad 94 and the body 10 easily, and, therefore, can avoid the damage of the micro elements 92 or the substrate 2, thereby improving the transfer yield.

In addition, taking the aforementioned example of the conventional substrate, regardless of the upward or downward warpage, the micro elements 92 on the carrier board 90 will deviate from the original position, so that the conductive bumps disposed on the conventional substrate may not be able to accurately align the micro elements 92, which may cause errors in the subsequent transfer and alignment process. In contrast, FIG. 3 also demonstrates that the arrangement of the first conductive bumps 22 and the second conductive bumps 24 can be non-equidistant. Those of ordinary skill in the art should understand that because the carrier board 90 shown in FIG. 3 is warped upwardly, the micro elements 92 at the center of the carrier board 90 will have more displacement than the micro elements 92 at the edge of the carrier board 90. In order to accurately align the first conductive bumps 22 and the second conductive bumps 24 with the corresponding metal pads 94, the first conductive bumps 22 and the second conductive bumps 24 should also be respectively arranged on the corresponding positions of the board 20 (or the transfer area). For example, there may be a first distance d1 between two adjacent first conductive bumps 22, and a second distance d2 between the adjacent first conductive bump 22 and the adjacent second conductive bump 24. In this embodiment, the first distance d1 will be slightly larger than the second distance d2. In other words, the conductive bumps (such as the first conductive bumps 22) arranged closer to the center point of the body 20 will be pulled apart, while the conductive bumps (such as the second conductive bumps 24) far from the center point of the body 20 will be slightly closer.

Figure 4:
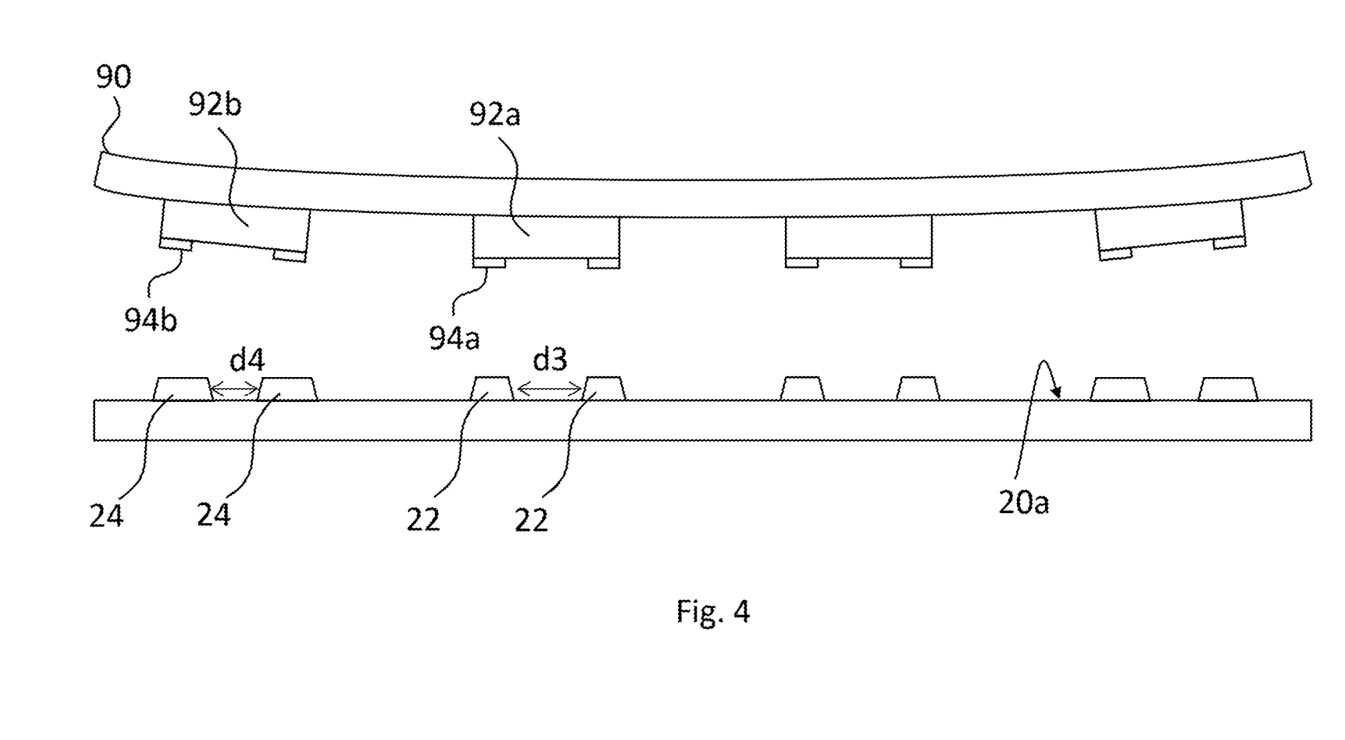
FIG. 4 is a schematic diagram of a substrate corresponded to a carrier board warped upwardly in accordance with the other embodiment of the present invention.

FIG. 1 shows that each micro element 92 has a metal pad 94, but this embodiment does not limit the number of metal pads 94 of the micro element 92. Such as micro element with flip chip structure can have more than two metal pads. Please refer to FIG. 4, FIG. 4 is a schematic diagram of a substrate corresponded to a carrier board warped upwardly in accordance with the other embodiment of the present invention. As shown in FIG. 4, assume that there are a plurality of micro elements 92a and micro elements 92b with flip chip structure on the carrier board 90. The micro elements 92a are disposed at the center of the carrier board 90 and have two corresponding metal pads 94a, and the micro elements 92b are disposed at the edge of the carrier board 90 and have two corresponding metal pads 94b. In practice, in order to connect the two metal pads 94a of the micro element 92a, two first conductive bumps 22 are also provided at corresponding positions on the body 20. Similarly, in order to connect the two metal pads 94b of the micro element 92b, two second conductive bumps 24 are also provided at corresponding positions on the body 20.

Same with the previous embodiment, since the carrier board 90 is warped upwardly, the micro elements 92a at the center of the carrier board 90 will have more displacement than the micro elements 92b at the edge of the carrier board 90. Therefore, the distance between the two metal pads 94a of the micro element 92a will be more separated, and the distance between the two metal pads 94b of the micro element 92b will be closer. In order to accurately align the first conductive bumps 22 with the corresponding metal pads 94a, the distance d3 between the first conductive bumps 22 can be larger than the distance d4 between the second conductive bumps 24. In other words, the previous embodiment exemplifies that each conductive bump corresponds to a micro element in a different position, and the conductive bumps are away from each other near the center point of the body 20 and closer to each other away from the center point of the body 20. This embodiment exemplifies that if the micro element has multiple metal pads, there will be a set of conductive bumps corresponding to the said micro element. The conductive bumps in the same set will be more separated when the set is near the center point of the body 20, and the conductive bumps in the same set will be closer when the set is away from the center point of the body 20.

Figure 5:
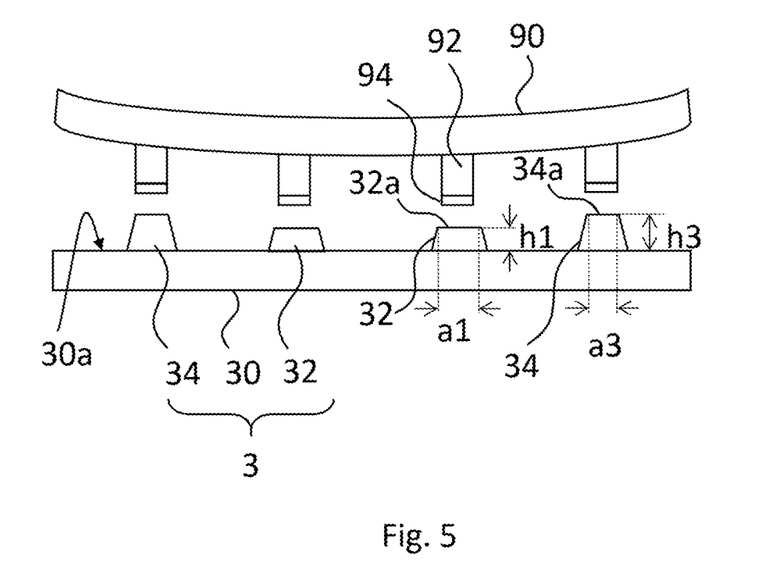
FIG. 5 is a schematic diagram of a substrate corresponded to a carrier board warped upwardly in accordance with one another embodiment of the present invention.

On the other hand, the conductive bumps may also have the same volume, but will have different shapes due to different locations. Please refer to FIG. 1 and FIG. 5 together, FIG. 5 is a schematic diagram of a substrate corresponded to a carrier board warped upwardly in accordance with one another embodiment of the present invention. As in the embodiment of FIG. 1, the carrier board 90 exemplified in FIG. 5 is also warped upwardly, and the substrate 3 also comprises a body 30, a plurality of first conductive bumps 32, and a plurality of second conductive bumps 34. In addition, an area (the first contact area 32a) of the first conductive bumps 32 intended to contact the micro element 92 may be a1, and the thickness of the first conductive bump 32 (the first thickness) may be h1. Different from the embodiment of FIG. 1, the volumes of the first conductive bumps 32 and the second conductive bumps 34 may be the same, but the first conductive bumps 32 and the second conductive bumps 34 may have different cross-sectional shapes. For example, an area (the second contact area 34a) of the second conductive bumps 34 intended to contact the micro element 92 may be a3, and the thickness of the second conductive bump 34 (the second thickness) may also be h3. The area a3 can be smaller than the area a1, and the thickness h3 can be larger than the thickness h1. This embodiment does not limit the shape of the second conductive bumps 34, but as can be seen from FIG. 5, the second conductive bumps 34 will be higher than the first conductive bumps 32, and the second conductive bumps 34 will be narrower than the first conductive bumps 32.

In the above embodiments of FIG. 1 to FIG. 5, the Young's modulus of the first conductive bumps and the second conductive bumps may be designed to have different values, and the values of the Young's modulus of the first conductive bumps and the second conductive bumps may correspond to different types of warpage of the carrier board 90. For example, when the carrier board 90 is warped upwardly, the Young's modulus of the conductive bumps (such as the first conductive bumps) that are closer to the center point of the body can be designed to have smaller value. On the contrary, the Young's modulus of the conductive bumps (such as the second conductive bumps) that are away from the center point of the body can be designed to have larger value. Those of ordinary skill in the art can understand that the Young's modulus is a parameter of an elastic material and is related to the amount of deformation that will occur when the first conductive bumps and the second conductive bumps are subjected to stress. In one example, since the Young's modulus of the first conductive bumps is smaller than the Young's modulus of the second conductive bumps, it means that the second conductive bumps are less likely to deform. When external pressure is applied to the carrier board, the second conductive bumps that are not easily deformed can be used to disperse the stress concentrated at the center point of the body, so that the stresses taken by the first conductive bumps and the second conductive bumps are approximately the same, thereby improving the transfer yield.

Figure 6:
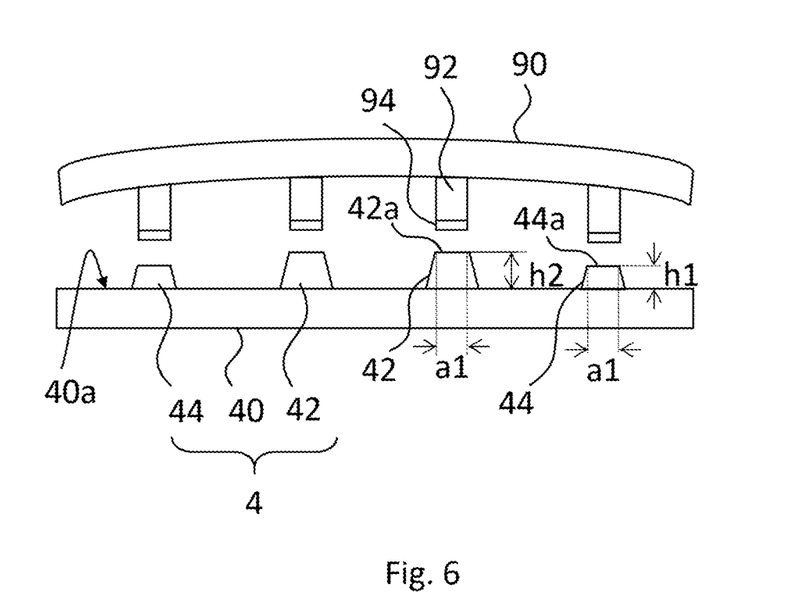
FIG. 6 is a schematic diagram of a substrate corresponded to a carrier board warped downwardly in accordance with an embodiment of the present invention.

The foregoing examples of FIGS. 1 to 5 correspond to the embodiment when the carrier board 90 is warped upwardly, but the invention is not limited thereto. Please refer to FIG. 1 and FIG. 6 together, FIG. 6 is a schematic diagram of a substrate corresponded to a carrier board warped downwardly in accordance with an embodiment of the present invention. Similar to the embodiment of FIG. 1, the substrate 4 illustrated in FIG. 6 also has a body 40, a plurality of first conductive bumps 42, and a plurality of second conductive bumps 44. The carrier board 90 also has a plurality of micro elements 92, and each micro element 92 has a metal pad 94. Different from the embodiment of FIG. 1, the carrier board 90 exemplified in FIG. 6 is warped downwardly, that is, the center of the carrier board 90 is farther away from the body 40, and the edge of the carrier board 90 is closer to the body 40. Since the carrier board 90 is warped downwardly in FIG. 6, the first conductive bumps 42 and the second conductive bumps 44 of this embodiment can have opposite properties, such as the volume of the first conductive bumps 42 (the first volume) is slightly larger than the volume of the second conductive bumps 44 (the second volume) in order to receive the micro elements 92 more effectively.

This embodiment also demonstrates an example of adjusting the thickness with a fixed area. In the example of FIG. 6, it is assumed that an area of the first conductive bumps 42 intended to contact the micro element 92 is a first contact area 42a, and an area of the second conductive bumps 44 intended to contact the micro element 92 is a second contact area 44a. The first contact area 42a and the second contact area 44a are the same, for example an area a1. Besides, the thickness of the first conductive bumps 42 and the second conductive bumps 44 will be different, for example, the thickness of the first conductive bumps 42 (the first thickness) is h2, the thickness of the second conductive bumps 44 (the second thickness) is h1, and the thickness h2 will be larger than the thickness h1. Because the first conductive bumps 42 of this embodiment are more protruding than the second conductive bumps 44, the first conductive bumps 42 and the second conductive bumps 44 at different positions can contact each individual metal pad 94 at approximately the same time when external pressure is applied to the substrate 4. In this embodiment, the first conductive bumps 42 and the second conductive bumps 44 can have approximately the same bonding strength with the metal pads 94, so that each micro element 92 can have the same conductivity, thereby improving the transfer yield. Those of ordinary skill in the art can understand that the volumes of the first conductive bumps 42 and the second conductive bumps 44 can also be determined according to the degree of warpage of the carrier board 90, and this embodiment is not limited herein. In the embodiment not shown in figures, more conductive bumps may also be included, wherein the conductive bumps can have gradually decreased thickness and volume from the inside to the outside corresponded to the downwardly warped carrier board.

Figure 7:
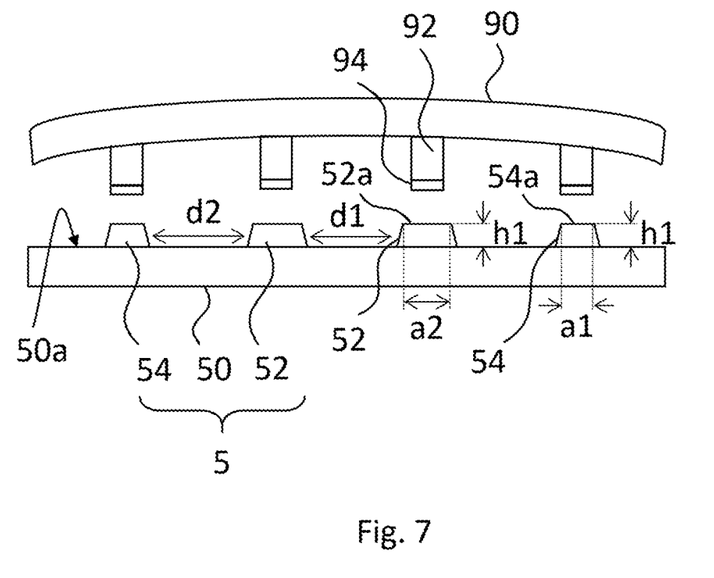
FIG. 7 is a schematic diagram of a substrate corresponded to a carrier board warped downwardly in accordance with another embodiment of the present invention.

In addition, please refer to FIG. 3 and FIG. 7 together, FIG. 7 is a schematic diagram of a substrate corresponded to a carrier board warped downwardly in accordance with another embodiment of the present invention. As in the embodiment of FIG. 3, the substrate 5 exemplified in FIG. 7 also has a body 50, a plurality of first conductive bumps 52, and a plurality of second conductive bumps 54. The carrier board 90 also has a plurality of micro elements 92, and each micro element 92 has a metal pad 94. Different from the embodiment of FIG. 3, the carrier board 90 exemplified in FIG. 7 is warped downwardly, that is, the center of the carrier board 90 is farther away from the body 50, and the edge is closer to the body 50. In view of FIG. 7, the first conductive bump 52 and the second conductive bump 54 of this embodiment will also design to have different volumes due to their different locations in order to allow the substrate 5 to receive the corresponding micro elements 92 on the carrier board 90 more effectively. The volume of the first conductive bumps 52 (the first volume) can be slightly larger than the volume of the second conductive bumps 54 (the second volume). Different from the embodiment of FIG. 6, FIG. 7 assumes that the thickness of the first conductive bumps 52 (the first thickness) is the same as the thickness of the second conductive bumps 54 (the second thickness), for example, both of thickness h1. An area (the first contact area 52a) of the first conductive bumps 52 intended to contact the micro element 92 may be a2, and an area (the second contact area 54a) of the second conductive bumps 54 intended to contact the micro element 92 may be a1, and the area a2 is larger than the area a1.

Since the carrier board 90 of FIG. 7 is warped downwardly, the micro elements 92 near the edge of the carrier board 90 are closer to the body 50, and the micro elements 92 near the center of the carrier board 90 are away from the body 50. When the external pressure is applied to the carrier board 90 against the substrate 5, the carrier board 90 will get closer and closer to the board body 50. Because the volume of the second conductive bumps 54 in this embodiment is smaller, even if the external pressure applied to the carrier board 90 is large enough to ensure that the micro elements 92 at the center of the carrier board 90 can be transferred, the second conductive bumps 54 can cope with the external pressure by deformation more easily. For example, the second conductive bumps 54 can overflow between the metal pad 94 and the body 50 easily, and, therefore, can avoid the damage of the micro elements 92 or the substrate 5, thereby improving the transfer yield.

FIG. 7 also demonstrates that the arrangement of the first conductive bumps 52 and the second conductive bumps 54 can be non-equidistant. Those of ordinary skill in the art should understand that because the carrier board 90 shown in FIG. 7 is warped downwardly, the micro elements 92 at the edge of the carrier board 90 will have more displacement than the micro elements 92 at the center of the carrier board 90. In order to accurately align the first conductive bumps 52 and the second conductive bumps 54 with the corresponding metal pads 94, the first conductive bumps 52 and the second conductive bumps 54 should also be respectively disposed on the corresponding positions of the body 50 (or the transfer area). For example, there may be a first distance d1 between two adjacent first conductive bumps 52, and a second distance d2 between the adjacent first conductive bump 52 and the adjacent second conductive bump 54. In this embodiment, the first distance d1 will be slightly smaller than the second distance d2. In other words, the conductive bumps (such as the second conductive bumps 54) arranged away from to the center point of the body 50 will be pulled apart, while the conductive bumps (such as the first conductive bumps 52) near the center point of the body 50 will be slightly closer.

Figure 8:
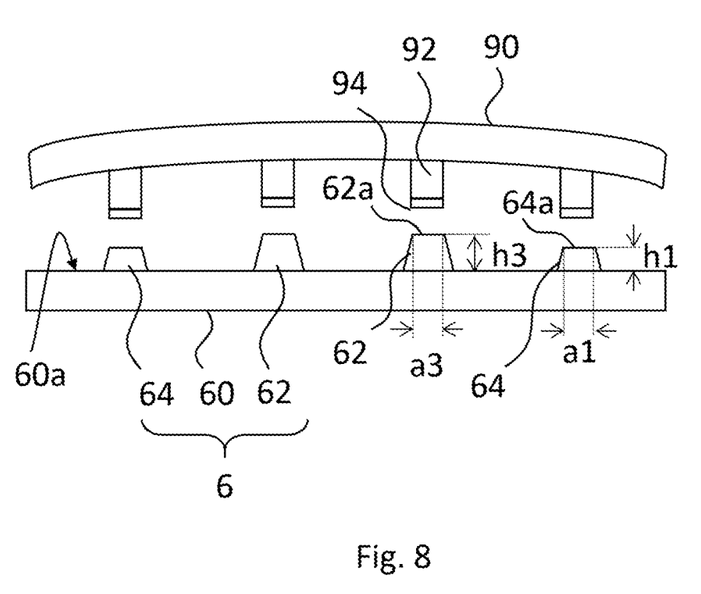
FIG. 8 is a schematic diagram of a substrate corresponded to a carrier board warped downwardly in accordance with the other embodiment of the present invention.

On the other hand, the conductive bumps may also have the same volume, but will have different shapes due to different locations. Please refer to FIG. 6 and FIG. 8 together, FIG. 8 is a schematic diagram of a substrate corresponded to a carrier board warped downwardly in accordance with the other embodiment of the present invention. As in the embodiment of FIG. 6, the carrier board 90 exemplified in FIG. 8 is also warped downwardly, and the substrate 6 also comprises a body 60, a plurality of first conductive bumps 62, and a plurality of second conductive bumps 64. In addition, an area (the second contact area 64a) of the second conductive bumps 64 intended to contact the micro element 92 may be a1, and the thickness of the second conductive bumps 64 (the second thickness) may be h1. Different from the embodiment of FIG. 6, the volumes of the first conductive bumps 62 and the second conductive bumps 64 may be the same. For example, an area (the first contact area 62a) of the first conductive bumps 62 intended to contact the micro element 92 may be a3, and the thickness of the first conductive bump 62 (the first thickness) may be h3. The area a3 can be smaller than the area a1, and the thickness h3 can be larger than the thickness h1. This embodiment does not limit the shape of the first conductive bump 62, but as can be seen from FIG. 8, the first conductive bump 62 will be higher than the second conductive bumps 64, and the first conductive bump 62 will be narrower than the second conductive bumps 64.

In the above embodiments of FIG. 6 to FIG. 8, the Young's modulus of the first conductive bumps and the second conductive bumps may be designed to have different values, and the values of the Young's modulus of the first conductive bumps and the second conductive bumps may correspond to different types of warpage of the carrier board 90. For example, when the carrier board 90 is warped downwardly, the Young's modulus of the conductive bumps (such as the second conductive bumps) that are away from to the center point of the body can be designed to have smaller value. On the contrary, the Young's modulus of the conductive bumps (such as the first conductive bumps) that are closer to the center point of the body can be designed to have larger value. In one example, since the Young's modulus of the second conductive bumps is smaller than the Young's modulus of the first conductive bumps, it means that the first conductive bumps are less likely to deform. When external pressure is applied to the carrier board, the first conductive bumps that are not easily deformed can be used to disperse the stress concentrated at the peripheral portion of the body, so that the stresses taken by the first conductive bumps and the second conductive bumps are approximately the same.

To summarize, the invention provides a substrate and a display device. The conductive bumps at different positions on the substrate are different, so that they can correspond to carrier boards with different warped shapes. For example, when the carrier board is warped upwardly, the conductive bumps on the edge of the substrate may have a larger volume or larger Young's modulus. Conversely, when the carrier board is warped downwardly, the conductive bumps on the edge of the substrate may have a smaller volume or a smaller Young's modulus, correspondingly. Thereby, the stress applied to the substrate can be spread evenly, and the bonding strength of each conductive bumps and metal pads can be substantially the same. Therefore, the substrate of the present invention can more efficiently receive the micro elements on the warped carrier board, thereby improving the transfer yield.

What is claimed is:

1. A substrate, configured to receive a plurality of micro elements on a carrier board, comprising:
   a body having a first surface defining a plurality of transfer areas, the each transfer area having a central portion and a peripheral portion;
   a first conductive bump, disposed on the central portion of the each transfer area, having a first volume; and
   a second conductive bump, disposed on the peripheral portion of the each transfer area, having a second volume;
   wherein the first volume is different from the second volume,
   wherein the first conductive bump has a first contact area on the first surface, the second conductive bump has a second contact area on the first surface, and when the first volume is larger than the second volume, the first contact area is larger than the second contact area.

2. The substrate according to claim 1, wherein the first conductive bump has a first thickness, the second conductive bump has a second thickness, and when the first volume is smaller than the second volume, the first thickness is smaller than the second thickness.

3. The substrate according to claim 2, wherein the first conductive bump has a first contact area on the first surface, the second conductive bump has a second contact area on the first surface, and the first contact area and the second contact area are the same.

4. The substrate according to claim 1, wherein the first conductive bump has a first contact area on the first surface, the second conductive bump has a second contact area on the first surface, and when the first volume is smaller than the second volume, the first contact area is smaller than the second contact area.

5. The substrate according to claim 4, wherein the first conductive bump has a first thickness, the second conductive bump has a second thickness, and the first thickness and the second thickness are the same.

6. The substrate according to claim 1, further comprises another first conductive bump, the two adjacent first conductive bumps are separated by a first distance, and the adjacent first conductive bump and the adjacent second conductive bump are separated by a second distance, when the first volume is smaller than the second volume, the first distance is larger than the second distance.

7. The substrate according to claim 6, further comprises another second conductive bump, when the first volume is smaller than the second volume, the interval between the two adjacent first conductive bumps is larger than the interval between the two adjacent second conductive bumps.

8. The substrate according to claim 1, wherein the first conductive bump has a first thickness, the second conductive bump has a second thickness, and when the first volume is larger than the second volume, and the first thickness is larger than the second thickness.

9. The substrate according to claim 8, wherein the first conductive bump has a first contact area on the first surface, the second conductive bump has a second contact area on the first surface, and the first contact area and the second contact area are the same.

10. The substrate according to claim 1, wherein the first conductive bump has a first thickness, the second conductive bump has a second thickness, and the first thickness and the second thickness are the same.

11. The substrate according to claim 1, further comprises another first conductive bump, the two adjacent first conductive bumps are separated by a first distance, and the adjacent first conductive bump and the adjacent second conductive bump are separated by a second distance, when the first volume is larger than the second volume, the first distance is smaller than the second distance.

12. The substrate according to claim 11, further comprises another second conductive bump, when the first volume is larger than the second volume, the interval between the two adjacent first conductive bumps is smaller than the interval between the two adjacent second conductive bumps.

13. The substrate according to claim 1, wherein the first conductive bump has a first Young's modulus, the second conductive bump has a second Young's modulus, and the first Young's modulus is larger than the second Young's modulus.

14. A substrate, configured to receive a plurality of micro elements on a carrier board, comprising:
a body having a first surface, defining a plurality of transfer areas and having a plurality of first conductive bumps and a plurality of second conductive bumps;
the plurality of first conductive bumps, disposed within the each transfer area, having a first cross sectional shape; and
the plurality of second conductive bumps, disposed within the each transfer area, having a second cross sectional shape;
wherein a center point is defined within the each transfer area;
wherein at least one the first conductive bump and at least one the second conductive bump are disposed in the same transfer area, and the second conductive bump is away from the center point;
wherein the first cross-sectional shape is different from the second cross-sectional shape, and the distance between the first conductive bump and the center point is smaller than the distance between the second conductive bump and the center point,
wherein the first conductive bump has a first volume, the second conductive bump has a second volume, and the first volume and the second volume are the same,
wherein the first conductive bump has a first thickness, the second conductive bump has a second thickness, the first thickness is larger than the second thickness, the first conductive bump has a first contact area on the first surface, the second conductive bump has a second contact area on the first surface, and the first contact area is smaller than the second contact area.

15. The substrate according to claim 14, wherein the first conductive bump has a first thickness, the second conductive bump has a second thickness, the first thickness is smaller than the second thickness, the first conductive bump has a first contact area on the first surface, the second conductive bump has a second contact area on the first surface, and the first contact area is larger than the second contact area.

16. The substrate according to claim 14, wherein the first conductive bump has a first Young's modulus, the second conductive bump has a second Young's modulus, and the first Young's modulus is larger than the second Young's modulus.

17. A display device, comprising:
a substrate, comprising:
a body having a first surface, defining a transfer area;
a first conductive bump, disposed within the transfer area, having a first volume and a first cross sectional shape; and
a second conductive bump, disposed within the transfer area, having a second volume and a second cross sectional shape; and
a plurality of micro elements respectively disposed on the first conductive bump and the second conductive bump;
wherein a center point is defined within the transfer area, and the distance between the first conductive bump and the center point is smaller than the distance between the second conductive bump and the center point,
wherein the first volume is different from the second volume, or the first cross-sectional shape is different from the second cross-sectional shape,
wherein the plurality of micro elements never overlap in normal direction of the substrate,
wherein the first conductive bump has a first contact area on the first surface, the second conductive bump has a second contact area on the first surface, and when the first volume is larger than the second volume, the first contact area is larger than the second contact area.

18. The display device according to claim 17, wherein the area of the first conductive bumps bonds the micro element and the area of the second conductive bumps bonds the micro element are the same.

19. The display device according to claim 17, wherein the first conductive bump and the corresponding micro element has a first height from the substrate, the second conductive bump and the corresponding micro element has a second height from the substrate, and the first height is different from the second height.

20. The display device according to claim 17, wherein the first surface further defines a plurality of transfer areas, and the center point is defined within the each transfer area.

* * * * *